United States Patent
Huang et al.

(10) Patent No.: US 6,427,976 B1
(45) Date of Patent: *Aug. 6, 2002

(54) LEAD-FRAME-BASED CHIP-SCALE PACKAGE AND METHOD OF MANUFACTURING THE SAME

(75) Inventors: Chien Ping Huang, Hsinchu; Eric Ko, Taichung Hsien, both of (TW)

(73) Assignee: Siliconware Precision Industries Co., Ltd. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/464,012

(22) Filed: Dec. 15, 1999

(51) Int. Cl.⁷ ................................................ H01L 23/02
(52) U.S. Cl. ........................ 253/676; 257/666; 257/787; 438/123; 438/124
(58) Field of Search ................. 257/666, 735, 257/787, 676; 438/123, 124

(56) References Cited

U.S. PATENT DOCUMENTS

| | | | |
|---|---|---|---|
| 5,157,480 A | * | 10/1992 | McShane et al. |
| 5,428,248 A | * | 6/1995 | Cha |
| 5,834,837 A | * | 11/1998 | Song |
| 5,898,216 A | * | 4/1999 | Steffen |
| 5,977,613 A | * | 11/1999 | Takata et al. |
| 5,998,877 A | * | 12/1999 | Ohuchi |
| 6,329,705 B1 | * | 12/2001 | Ahmad |

* cited by examiner

Primary Examiner—Sheila V. Clark
(74) Attorney, Agent, or Firm—Peter F. Corless; Steven M. Jensen; Edwards & Angell, LLP

(57) ABSTRACT

A lead-frame-based chip-scale package (CSP) structure and a method of manufacturing the same are proposed. The proposed CSP structure is characterized in the use of a specially-designed lead frame having an inner-lead part and an outer-lead part, which each inner lead being formed with a deformed portion. During the encapsulation process, an epoxy molding compound (EMC) is formed to encapsulate the semiconductor die and the inner-lead part. By the proposed CSP structure, both sides of the inner-lead part can be wrapped by the EMC due to it being raised by the deformed portion to within the EMC. As a result, during the lead-singulation process, the inner-lead part can be firmly supported in position, thereby reducing the occurrence of micro cracks in the EMC above the inner-lead part that would otherwise occur in the prior art.

10 Claims, 3 Drawing Sheets

LEAD-FRAME-BASED CHIP-SCALE PACKAGE AND METHOD OF MANUFACTURING THE SAME

BACKGROUND OF THE INVENTION

1. Field of the Invention

This invention relates to integrated circuit (IC) packages, and more particularly, to a lead-frame-based chip-scale package (CSP) and a method of manufacturing the same.

2. Description of Related Art

A chip-scale package (CSP), as the name implies, is an IC package whose overall size is nearly the same as the semiconductor chip packed therein. A CSP structure that is based on a lead frame for the attachment of the chip is customarily referred to as a lead-frame-based chip-scale package (hereinafter abbreviated as L/F-based CSP structure).

Conventionally, many various types of L/F-based CSP structures have been proposed and introduced to the market. For example, Fujitsu introduces a SON (Small Outline Non-Leaded) type of CSP structure; LG Semicon introduces a BLP (Bottom Leaded Plastic) type of CSP structure; Matsushita introduces a QFN (Quad Flat Non-Leaded) type of CSP structure; and Toshiba introduces a QON (Quad Outline Non-Leaded) type of CSP structure, to name just a few. All these types of CSP structures utilize a lead frame for chip attachment, and the inner leads of the lead frame have one side exposed to the bottom outside of the package body for electrically coupling to the surface of an external circuit board through SMT (Surface-Mount Technology).

One drawback to the forgoing types of L/F-based CSP structures, however, is that during the lead-singulation process to punch away the outer-lead part of the lead frame, it would easily cause micro cracks in the epoxy molding compound (EMC). This drawback is illustratively depicted in FIGS. 1A–1C, which respectively show a BLP type, a QFN type, and a QON type of CSP structure.

Referring to FIG. 1A, the BLP type of CSP structure is based on a lead frame 10 for the attachment of a semiconductor die 11. The lead frame 10 is formed with an inner-lead part 10a and an outer-lead part 10b. After an EMC 12 is formed to encapsulate the semiconductor die 11 and the inner-lead part 10a of the lead frame 10, a lead-singulation process is performed to punch away the exposed outer-lead part 10b of the lead frame 10. The lead-singulation process, however, would cause micro cracks, as the part designated by the reference numeral 13, in the EMC 12 right above the encapsulated inner-lead part 10a.

Referring to FIG. 1B, the QFN type of CSP structure is based on a lead frame 20 for the attachment of a semiconductor die 21. The lead frame 20 is formed with an inner lead part 20a and an outer-lead part 20b. After an EMC 22 is formed to encapsulate the semiconductor die 21 and the inner-lead part 20a of the lead frame 20, a lead-singulation process is performed to punch away the exposed outer-lead part 20b of the lead frame 20. The lead-singulation process, however, would also cause micro cracks, as the part designated by the reference numeral 23, in the EMC 22 right above the encapsulated inner-lead part 20a.

Referring to FIG. 1C, the QON type of CSP structure is based on a lead frame 30 for the attachment of a semiconductor die 31. The lead frame 30 is formed with an inner-lead part 30a and an outer-lead part 30b. After an EMC 32 is formed to encapsulate the semiconductor die 31 and the inner-lead part 30a of the lead frame 30, a lead-singulation process is performed to punch away the exposed outer-lead part 30b of the lead frame 30. The lead-singulation process, however, would likewise cause micro cracks, as the part designated by the reference numeral 33, in the EMC 32 right above the encapsulated inner-lead part 30a.

The occurrence of the above-mentioned micro-cracks is due to the reason that the inner-lead part has only one side bonded to the EMC while the other side is exposed to the bottom outside of the EMC. The exposed side is hence lack of firm support against the punching force during the lead-singulation process.

One solution to the foregoing problem is disclosed in Toshiba's U.S. Pat. No. 5,703,407, which is illustrated in FIG. 1D. As shown, this patented package structure is based on a lead frame 40 for the attachment of a semiconductor die 41. The lead frame 40 is formed with an inner-lead part 40a and an outer-lead part 40b. Further, an EMC 42 is formed to encapsulate the semiconductor die 41 and the inner-lead part 40a of the lead frame 40. After this, a lead-singulation process is performed to punch away the exposed outer-lead part 40b of the lead frame 40. This patent is characterized in the step of performing a half-etching process on the inner-lead part 40a of the lead frame 40, which can help strengthen the bonding between the EMC 42 and the stop side of the inner-lead part 40a of the lead frame 40 so that it would become more resistible against the punching force during the lead-singulation process. One drawback to this solution, however, is that the half-etching technology is quite costly to use, and thus it would considerably increase the overall manufacture cost of the IC package.

SUMMARY OF THE INVENTION

It is therefore an objective of this invention to provide an L/F-based CSP structure and a method of manufacturing the same, which can help prevent the lead-singulation process from causing micro cracks in the EMC.

It is another objective of this invention to provide an L/F-based CSP structure and a method of manufacturing the same, which can be implemented without having to use the high-cost half-etching technology.

In accordance with the foregoing and other objectives, the invention proposes a new CSP structure and a method of manufacturing this CSP structure. The proposed CSP structure comprises: a lead frame having a plurality of inner leads, with each inner lead being formed with a deformed portion; at least one semiconductor die mounted on the lead frame; a set of bonding wires for electrically coupling the semiconductor die to the inner leads; and an EMC for encapsulating the semiconductor die, the bonding wires, and the inner leads, wherein both sides of each inner lead can be wrapped by the EMC due to each inner lead being raised by the deformed portion to within the EMC. During the lead-singulation process, the outer-lead part of the lead frame is punched away.

By the invention, both sides of the inner-lead part can be wrapped by the EMC due to it being raised to a predetermined height from the bottom side of the entire package body by the deformed portion. As a result, during the lead-singulation process, the inner-lead part can be firmly supported in position, thereby reducing the occurrence of micro cracks in the EMC above the inner-lead part that would otherwise occur in the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

This section discloses six embodiments of the invention implemented on different types of IC packages. Besides these embodiments, various others are possible.

Figure 1A:
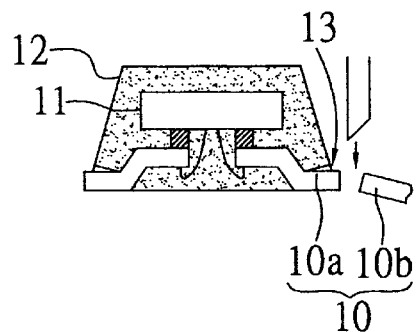
FIGS. 1A–1D (PRIOR ART) are schematic sectional diagrams respectively showing four examples of conventional L/F-based CSP structures that would easily cause micro cracks in the EMC during lead-singulation process.
Figure 1B:
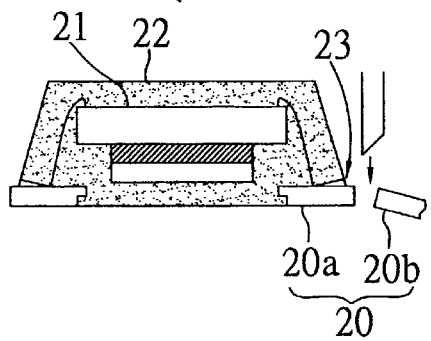
Figure 1C:
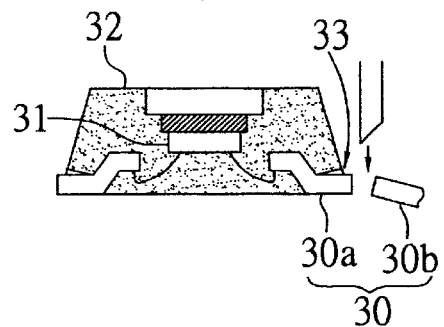
Figure 1D:
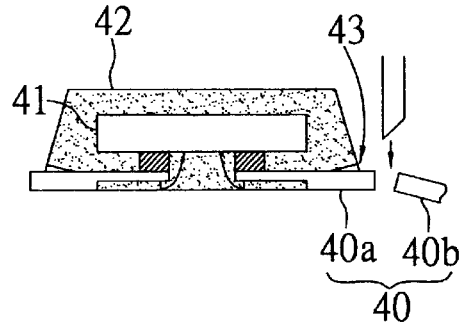
Figure 2A:
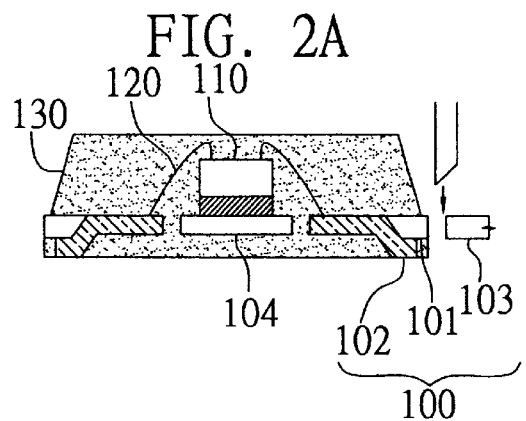
FIGS. 2A–2F are schematic sectional diagrams showing various types of IC packages that are structured and manufactured according to the invention.

First Preferred Embodiment (FIG. 2A)

FIG. 2A shows an L/F-based CSP structure which is manufactured in accordance with the invention. As shown, this CSP structure includes a specially-designed lead frame 100 for the attachment of a semiconductor die 110.

Figure 3:
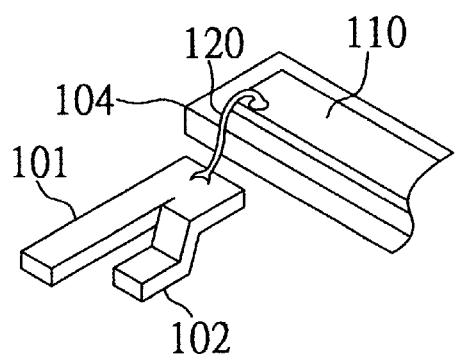
FIG. 3 is a schematic perspective diagram showing the structure of a specially-designed lead frame utilized by the invention.

As shown in FIG. 3, the lead frame 100 is formed with an inner-lead part 101, a leg portion 102, an outer-lead part 103, and a die pad 104. The forming of the leg portion 102 is a characteristic feature of the invention, which is cut apart from each inner lead 101 and bent downwards away from the same by a predetermined down-set distance.

The semiconductor die 110 is electrically coupled to the inner-lead part 101 of the lead frame 100 by means of a set of bonding wires 120. Further, an epoxy molding compound (EMC) 130 is formed to encapsulate the semiconductor die 110, the inner-lead part 101 of the lead frame 100, and the bonding wires 120, while exposing the bottom side of the leg portion 102 and the whole of the outer-lead part 103 of the lead frame 100. The exposed leg portion 102 will be later used to electrically couple the encapsulated semiconductor die 110 to the surface of an external circuit board (not shown) through SMT (Surface-Mount Technology).

During the subsequent lead-singulation process, the exposed outer-lead part 103 of the lead frame 100 is punched away. By the invention, both sides of the inner-lead part 101 can be wrapped by the EMC 130 due to it being raised to a predetermined height from the bottom side of the entire package body by the leg portion 102. As a result, during the lead-singulation process, the inner-lead part 101 can be firmly supported in position, thereby reducing the occurrence of micro cracks in the EMC 130 above the inner-lead part 101 that would otherwise occur in the prior art.

Figure 2B:
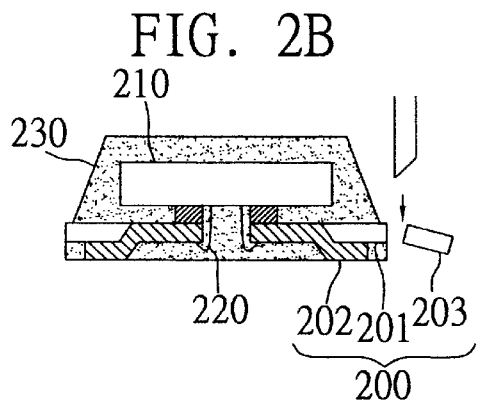

Second Preferred Embodiment (FIG. 2B)

FIG. 2B shows a second preferred embodiment of the invention. As shown, this embodiment is an LOC (Lead On Chip) type of IC package, which includes a specially designed lead frame 200 for the attachment of a semiconductor die 210.

The lead frame 200 is formed with an inner-lead part 201, a leg portion 202, and an outer-lead part 203. The leg portion 202 is shaped in the same manner as that shown in FIG. 3, which is cut apart from each inner lead 201 and bent downwards away from the same by a predetermined downset distance.

The semiconductor die 210 is electrically coupled to the inner-lead part 201 of the lead frame 200 by means of a set of bonding wires 220. Further, an EMC 230 is formed to encapsulate the semiconductor die 210, the inner-lead part 201 of the lead frame 200, and the bonding wires 220, while exposing the bottom side of the leg portion 202 and the whole of the outer-lead part 203 of the lead frame 200. The exposed leg portion 202 will be later used to electrically couple the encapsulated semiconductor die 210 to the surface of an external circuit board (not shown) through SMT.

During the subsequent lead-singulation process, the exposed outer-lead part 203 of the lead frame 200 is punched away. By the invention, both sides of the inner-lead part 201 can be wrapped by the EMC 230 due to it being raised to a predetermined height from the bottom side of the entire package body by the leg portion 202. As a result, during the lead-singulation process, the inner-lead part 201 can be firmly supported in position, thereby reducing the occurrence of micro cracks in the EMC 230 above the inner-lead part 201 that would otherwise occur in the prior art.

Figure 2C:
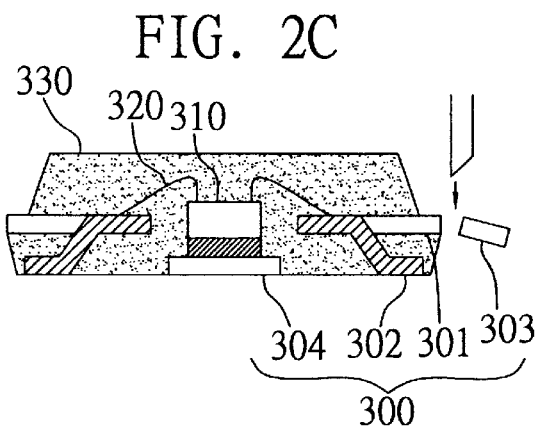

Third Preferred Embodiment (FIG. 2C)

FIG. 2C shows a third preferred embodiment of the invention. As shown, this embodiment is a QFN (Quad Flat Non-Leaded) type of IC package, which includes a specially designed lead frame 300 for the attachment of a semiconductor die 310.

The lead frame 300 is formed with an inner-lead part 301, a leg portion 302, an outer-lead part 303, and a die pad 304. The leg portion 302 is shaped in the same manner as that shown in FIG. 3, which is cut apart from each inner lead 301 and bent downwards away from the same by a predetermined downset distance.

The semiconductor die 310 is electrically coupled to the inner-lead part 301 of the lead frame 300 by means of a set of bonding wires 320. Further, an EMC 330 is formed to encapsulate the semiconductor die 310, the inner-lead part 301 of the lead frame 300, and the bonding wires 320, while exposing the bottom side of the leg portion 302 and the whole of the outer-lead part 303 of the lead frame 300. The exposed leg portion 302 will be later used to electrically couple the encapsulated semiconductor die 310 to the surface of an external circuit board (not shown) through SMT.

During the subsequent lead-singulation process, the exposed outer-lead part 303 of the lead frame 300 is punched away. By the invention, both sides of the inner-lead part 301 can be wrapped by the EMC 330 due to it being raised to a predetermined height from the bottom side of the entire package body by the leg portion 302. As a result, during the lead-singulation process, the inner-lead part 301 can be firmly supported in position, thereby reducing the occurrence of micro cracks in the EMC 330 above the inner-lead part 301 that would otherwise occur in the prior art.

Figure 2D:
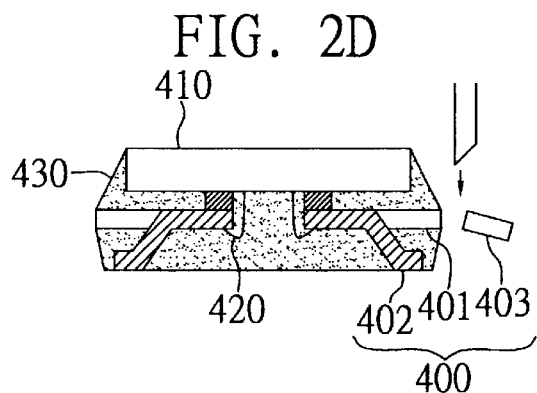

Fourth Preferred Embodiment (FIG. 2D)

FIG. 2D shows a fourth preferred embodiment of the invention. As shown, this embodiment is a chip-exposed type of IC package, which includes a specially designed lead frame 400 for the attachment of a semiconductor die 410 whose back side is exposed to the outside of the package body. The lead frame 400 is formed with an inner-lead part 401, a leg portion 402, and an outer-lead part 403. The leg portion 402 is shaped in the same manner as that shown in FIG. 3, which is cut apart from each inner lead 401 and bent downwards away from the same by a predetermiend downset distance.

The semiconductor die 410 is electrically coupled to the inner-lead part 401 of the lead frame 400 by means of a set of bonding wires 420. Further, an EMC 430 is formed to encapsulate the semiconductor die 410, the inner-lead part 401 of the lead frame 400, and the bonding wires 420, while exposing the bottom side of the leg portion 402 and the whole of the outer-lead part 403 of the lead frame 400. The exposed leg portion 402 will be later used to electrically couple the encapsulated semiconductor die 410 to the surface of an external circuit board (not shown) through SMT.

During the lead-singulation process, the exposed outer-lead part 403 of the lead frame 400 is punched away. By the invention, both sides of the inner-lead part 401 can be wrapped by the EMC 430 due to it being raised to a predetermined height from the bottom side of the entire package body by the leg portion 402. As a result, during the lead-singulation process, the inner-lead part 401 can be firmly supported in position, thereby reducing the occurrence of micro cracks in the EMC 430 above the inner-lead part 401 that would otherwise occur in the prior art.

Figure 2E:
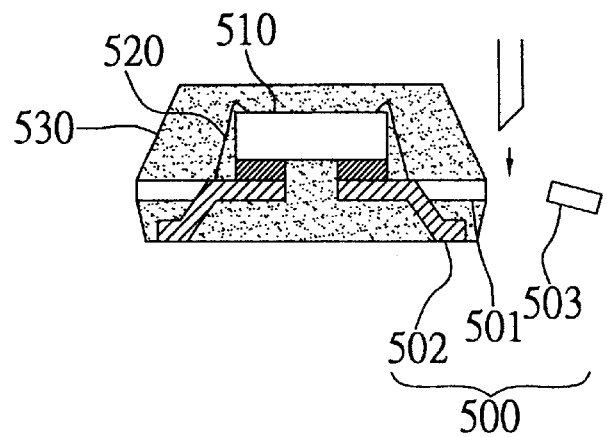

Fifth Preferred Embodiment (FIG. 2E)

FIG. 2E shows a fifth preferred embodiment of the invention. As shown, this embodiment is a type of IC package which is based on a specially designed lead frame 500 having no die pad for the attachment of a semiconductor die 510. The lead frame 500 is formed with an inner-lead part 501, a leg portion 502, and an outer-lead part 503. The leg portion 502 is shaped in the same manner as that shown in FIG. 3, which is cut apart from each inner lead 501 and bent downwards away from the same by a predetermined downset distance.

The semiconductor die 510 is electrically coupled to the inner-lead part 501 of the lead frame 500 by means of a set of bonding wires 520. Further, an EMC 530 is formed to encapsulate the semiconductor die 510, the inner-lead part 501 of the lead frame 500, and the bonding wires 520, while exposing the bottom side of the leg portion 502 and the whole of the outer-lead part 503 of the lead frame 500. The exposed leg portion 502 will be later used to electrically couple the encapsulated semiconductor die 510 to the surface of an external circuit board (not shown) through SMT.

During the lead-singulation process, the exposed outer-lead part 503 of the lead frame 500 is punched away. By the invention, both sides of the inner-lead part 501 can be wrapped by the EMC 530 due to it being raised to a predetermined height from the bottom side of the entire package body by the leg portion 502. As a result during the lead-singulation process, the inner-lead part 501 can be firmly supported in position, thereby reducing the occurrence of micro cracks in the EMC 530 above the inner-lead part 501 that would otherwise occur in the prior art.

Figure 2F:
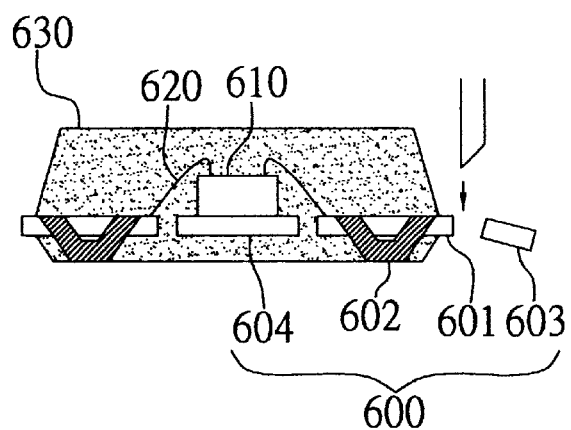

Sixth Preferred Embodiment (FIG. 2F)

FIG. 2F shows a sixth preferred embodiment of the invention. As shown, this embodiment is a type of IC package which includes a specially designed lead frame 600 for the attachment of a semiconductor die 610.

The lead frame 600 is formed with an inner-lead part 601, an outer-lead part 603, and a die pad 604. This lead frame 600 differs from those used in the foregoing embodiments particularly in that a downward-protruded portion 602 is formed on the bottom side of each inner lead 601 to a predetermined downset height. This downward-protruded portion 602 is functionally equivalent to the leg portions used in the foregoing embodiments.

The semiconductor die 610 is electrically coupled to the inner-lead part 601 of the lead frame 600 by means of a set of bonding wires 620. Further, an EMC 630 is formed to encapsulate the semiconductor die 610, the inner-lead part 601 of the lead frame 600, and the bonding wires 620, while exposing the bottom side of the downward-protruded portion 602 and the whole of the outer-lead part 603 of the lead frame 600. The exposed downward-protruded portion 602 will be later used to electrically couple the encapsulated semiconductor die 610 to the surface of an external circuit board (not shown) through SMT.

During the lead-singulation process, the exposed outer-lead part 603 of the lead frame 600 is punched away. By the invention, both sides of the inner-lead part 601 can be wrapped by the EMC 630 due to it being raised to a predetermined height from the bottom side of the entire package body by the downward-protruded portion 602. As a result, during the lead-singulation process, the inner-lead part 601 can be firmly supported in position, thereby reducing the occurrence of micro cracks in the EMC 630 above the inner-lead part 601 that would otherwise occur in the prior art.

Conclusion

The invention has been described using exemplary preferred embodiments. However, it is to be understood that the scope of the invention is not limited to the disclosed embodiments. On the contrary, it is intended to cover various modifications and similar arrangement. The scope of the claims, therefore, should be accorded the broadest interpretation so as to encompass all such modifications and similar arrangements.

What is claimed is:

1. An IC package, which comprises:
    a lead frame having a plurality of inner leads, with each inner lead being formed with a deformed portion which supports each inner lead at a predetermined height, wherein the deformed portion is formed by partially splitting apart the inner lead along a length of the inner lead and deforming one split part of the inner lead;
    at least one semiconductor die mounted on the lead frame;
    a set of bonding wires for electrically coupling the semiconductor die to the inner leads; and
    an epoxy molding compound for encapsulating the semiconductor die, the bonding wires, and the inner leads;
    wherein both sides of each inner lead are wrapped by the epoxy molding compound due to each inner lead being raised to the predetermined height by the deformed portion within the epoxy molding compound.

2. The IC package of claim 1, wherein the deformed portion of each inner lead is formed by downwardly bending the split part of the inner lead away from the inner lead to a predetermined downset distance.

3. The IC package of claim 1, wherein the deformed portion of each inner lead is formed by deforming the split part of the inner lead into a downward-protruded portion from the inner lead.

4. A method for manufacturing a CSP type of IC package, comprising the steps of:
    preparing a lead frame having an inner-lead part and an outer-lead part, with the inner-lead part including a deformed portion which supports the inner-lead part at a predetermined height, wherein the deformed portion is formed by partially splitting apart the inner-lead part along a length of the inner-lead part and deforming one split part of the inner-lead part;
    attaching at least one semiconductor die on the lead frame;

performing a wire-bonding process to electrically couple the semiconductor die to the inner-lead part of the lead frame;

performing an encapsulation process to form an epoxy molding compound to encapsulate the semiconductor die, the bonding wires, and the inner-lead part of the lead frame; wherein both sides of the inner-lead part are wrapped by the epoxy molding compound due to the inner-lead part being raised to the predetermined height by the deformed portion within the epoxy molding compound; and performing a lead-singulation process to punch away the exposed outer-lead part of the lead frame.

5. The method of claim 4, wherein the deformed portion of each inner-lead part is formed by downwardly bending the split part of the inner-lead part away from the inner-lead part to a predetermined downset distance.

6. The method of claim 4, wherein the deformed portion of each inner-lead part is formed by deforming the split part of the inner-lead part into a downward-protruded portion from the inner-lead part.

7. The IC package of claim 1, wherein the deformed portion of each inner lead is bent downwardly and away from the semiconductor die.

8. The IC package of claim 2, wherein the deformed portion of each inner lead is bent downwardly and away from the semiconductor die.

9. The method of claim 4, wherein the deformed portion of each inner-lead part is bent downwardly and away from the semiconductor die.

10. The method of claim 5, wherein the deformed portion of each inner-lead part is bent downwardly and away from the semiconductor die.

* * * * *